(12) United States Patent
Huang et al.

(10) Patent No.: US 11,948,834 B2
(45) Date of Patent: *Apr. 2, 2024

(54) SELECTIVE DEPOSITION OF BARRIER LAYER

(71) Applicant: Taiwan Semiconductor Manufacturing Co., Ltd., Hsin-Chu (TW)

(72) Inventors: Hsin-Yen Huang, New Taipei (TW); Hai-Ching Chen, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 12 days.

This patent is subject to a terminal disclaimer.

(21) Appl. No.: 17/671,222

(22) Filed: Feb. 14, 2022

(65) Prior Publication Data

US 2022/0165613 A1 May 26, 2022

Related U.S. Application Data

(63) Continuation of application No. 16/837,968, filed on Apr. 1, 2020, now Pat. No. 11,251,073.

(51) Int. Cl.
| | | |
|---|---|---|
| H01L 21/768 | (2006.01) |
| H01L 21/02 | (2006.01) |
| H01L 21/306 | (2006.01) |
| H01L 21/311 | (2006.01) |

(52) U.S. Cl.
CPC .. *H01L 21/76816* (2013.01); *H01L 21/02164* (2013.01); *H01L 21/02172* (2013.01); *H01L 21/0228* (2013.01); *H01L 21/30604* (2013.01); *H01L 21/31116* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

*Primary Examiner* — Asok K Sarkar
(74) *Attorney, Agent, or Firm* — HAYNES AND BOONE, LLP

(57) ABSTRACT

Integrated circuit devices and methods of forming the same are provided. A method according to the present disclosure includes providing a workpiece including a semiconductor substrate, a first ILD layer over the semiconductor substrate, and a first metal feature in the first ILD layer; depositing a second metal feature over the workpiece such that the second metal feature is electrically coupled to the first metal feature; patterning the second metal feature to form a first trench adjacent to the first metal feature; depositing a blocking layer over the workpiece, wherein the blocking layer selectively attaches to the first ILD layer; depositing a barrier layer over the workpiece, wherein the barrier layer selectively forms over the second metal feature relative to the first ILD layer; and depositing a second ILD layer over the workpiece.

20 Claims, 14 Drawing Sheets

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,879,107 | B2 | 12/2020 | Dutta et al. |
| 11,024,577 | B1 | 6/2021 | Park et al. |
| 11,049,799 | B1 | 6/2021 | Lin et al. |
| 11,081,342 | B2 | 8/2021 | Farm et al. |
| 11,094,535 | B2 | 8/2021 | Tois et al. |
| 2004/0266167 | A1 | 12/2004 | Dubin et al. |
| 2019/0148144 | A1* | 5/2019 | Liu .................. C23C 16/45525 257/632 |
| 2020/0144103 | A1 | 5/2020 | Kim et al. |
| 2021/0082802 | A1 | 3/2021 | Huang et al. |
| 2021/0082814 | A1 | 3/2021 | Lee et al. |
| 2021/0257295 | A1 | 8/2021 | Chan et al. |

\* cited by examiner

SELECTIVE DEPOSITION OF BARRIER LAYER

This application is a Continuation of U.S. patent application Ser. No. 16/837,968, filed Apr. 1, 2020, which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, contacts of the MLI features are exhibiting increased contact resistance and impeding current flow, which presents performance, yield, and cost challenges. It has been observed that higher contact resistances and increasing current paths introduced by contacts in advanced IC technology nodes can significantly delay (and, in some situations, prevent) signals from being routed efficiently to and from IC devices, such as transistors, negating any improvements in performance of such IC devices in the advanced technology nodes. Accordingly, although existing contacts have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
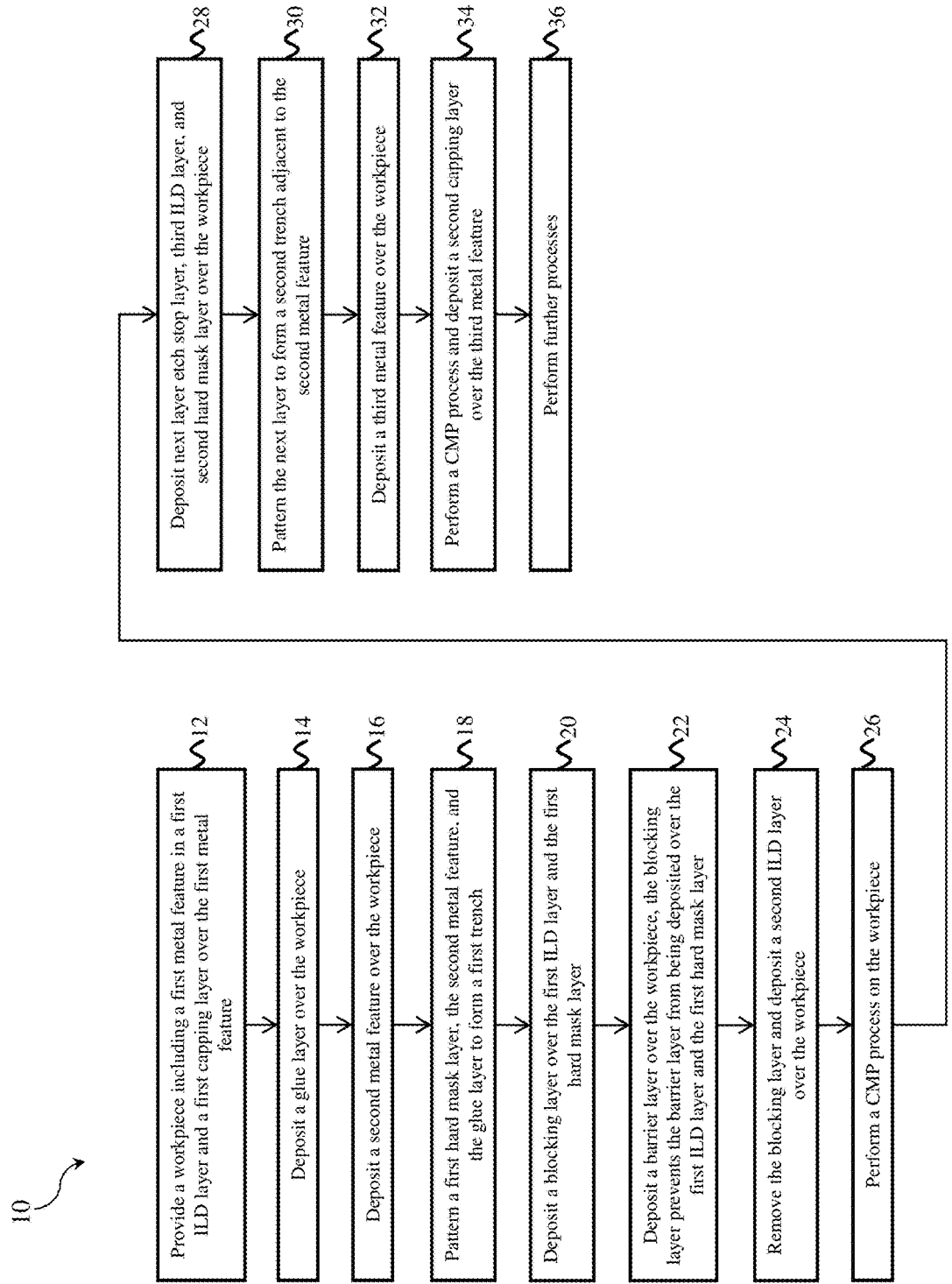
FIG. 1 is a flow chart of a method for fabricating a contact structure of an integrated circuit device according to various aspects of the present disclosure.

The present disclosure relates generally to integrated circuit (IC) devices, and more particularly, to multi-layer interconnect (MLI) features of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

The present disclosure generally relates to BEOL processes directed at fabricating an MLI structure for planar IC devices and/or non-planar IC devices (for example, fin-like field effect transistors (FinFETs)). An MLI structure may include a plurality of conductive layers. Methods for fabricating an MLI structure disclosed herein form an MLI that includes a barrier layer selectively deposited on metal surfaces. MLI structures disclosed herein have thus been observed to provide high metal gap-fill performance and to prevent and/or limit damage to gap-fill material, such as interlayer dielectric (ILD) layers, during etching. Moreover, MLI structures disclosed herein may prevent line-line leakage and barrier layer bridging between metal features. Different embodiments may have different advantages, and no particular advantage is required of any embodiment.

FIG. 1 is a flow chart of a method 10 for fabricating an MLI structure of an integrated circuit (IC) device according to various aspects of the present disclosure. At block 12, a workpiece is provided. The workpiece includes a first metal feature in a first ILD layer and a first capping layer over the first metal feature. At block 14, a glue layer is deposited over the workpiece. At block 16, a second metal feature is deposited over the workpiece. At block 18, a first hard mask layer is formed, then the first hard mask layer, the second metal feature, and the glue layer are patterned to form a first trench adjacent to the first metal feature. At block 20, a blocking layer is deposited over the first ILD layer and the first hard mask layer. At block 22, a barrier layer is deposited over the workpiece. The blocking layer prevents or at least substantially limits a barrier layer from being deposited over the first ILD layer and the first hard mask layer. At block 24, the blocking layer is removed, and a second ILD layer is deposited over the workpiece. At block 26, a chemical mechanical planarization/polishing (CMP) process is performed on the workpiece. At block 28, a next layer etch stop layer, third ILD layer, and second hard mask layer are deposited over the workpiece. At block 30, the next layer is patterned to form a second trench adjacent to the second metal feature. At block 32, a third metal feature is deposited over the workpiece. At block 34, a CMP process is performed, and a second capping layer is deposited over the third metal feature. At block 36 further processes are performed to fabricate the MLI. Additional steps can be provided before, during, and after the method 10, and some of the steps described can be replaced or eliminated for other embodiments of the method 10.

Blocks of the method 10 of FIG. 1 may be better described in conjunction with FIGS. 2-13. FIGS. 2-13 are fragmentary cross-sectional diagrammatic views of a workpiece 100 of an IC device at various fabrication stages of a method, such as method 10 of FIG. 1, according to various aspects of the present disclosure. Workpiece 100 can be included in a microprocessor, a memory, and/or other IC device. In some implementations, workpiece 100 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2-13 have been simplified for the sake of clarity to better understand the inventive concepts of the present disclosure. Additional features can be added in workpiece 100, and some of the features described below can be replaced, modified, or eliminated in other embodiments of workpiece 100.

Figure 2:
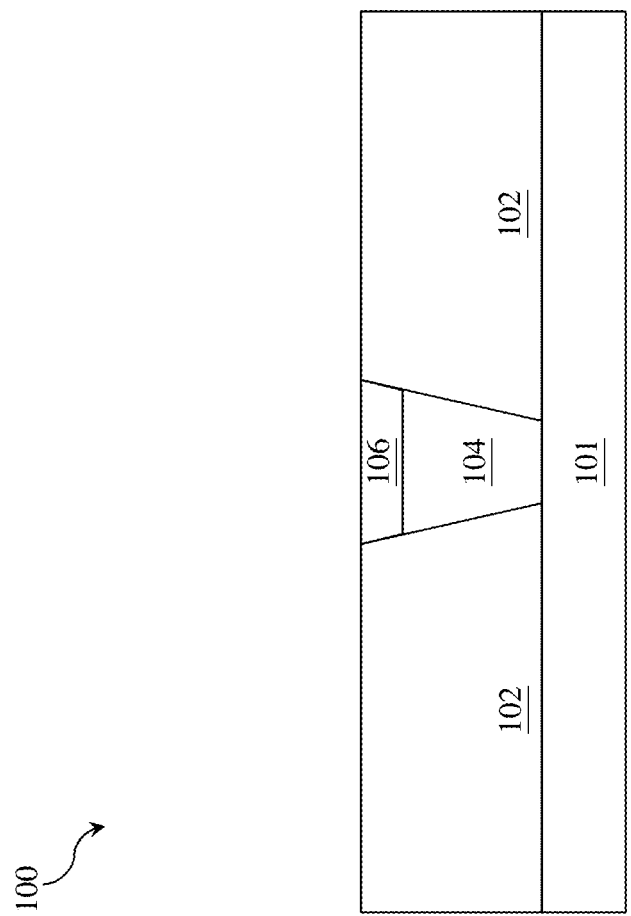
FIGS. 2-13 are fragmentary cross-sectional diagrammatic views of a contact structure at various fabrication stages of a method, such as the method of FIG. 1, according to various aspects of the present disclosure.

Reference is made to FIGS. 1 and 2. The method 10 starts with block 12 where a workpiece 100 is provided. The workpiece 100 includes a substrate 101. In some embodiments, the substrate 101 may be a semiconductor substrate such as a silicon substrate. The substrate 101 may include various layers, including conductive or insulating layers formed thereon. The substrate 101 may include various doping configurations depending on various design requirements. The substrate 101 may also include other semiconductors such as germanium, silicon carbide (SiC), silicon germanium (SiGe), or diamond. Alternatively, the substrate 101 may include a compound semiconductor and/or an alloy semiconductor. Further, the substrate 101 may optionally include an epitaxial layer (epi-layer), may be strained for performance enhancement, may include a silicon-on-insulator (SOI) structure, and/or have other suitable enhancement features. The isolation regions may include silicon oxide, silicon nitride, silicon oxynitride, fluoride-doped silicate glass (FSG), a low-K dielectric material, and/or other suitable materials. In many embodiments, the isolation regions include shallow trench isolation (STI) features. The workpiece 100 includes a first ILD layer 102 over the substrate 101. The first ILD layer 102 includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. The workpiece 100 includes a first metal feature 104 in the first ILD layer 102 and a first capping layer 106 over the first metal feature 104. In some embodiments, the first metal feature 104 may include a first metal, such as copper, cobalt, ruthenium, molybdenum, chromium, tungsten, manganese, rhodium, iridium, nickel, palladium, platinum, silver, gold, aluminum, and a combination thereof. In some embodiments, the capping later 106 may include a second metal, such as copper, cobalt, ruthenium, molybdenum, chromium, tungsten, manganese, rhodium, iridium, nickel, palladium, platinum, silver, gold, aluminum, and a combination thereof. The first metal feature 104 and the first capping layer 106 may be deposited using physical vapor deposition (PVD), chemical vapor deposition (CVD), or atomic layer deposition (ALD). In one or more embodiments, a thickness of the first metal feature 104 may range from about 50 to about 500 Å, and a thickness of the first capping layer 106 may range from about 2 to about 50 Å. In one embodiment, the first metal feature 104 consists essentially of the first metal, the first capping layer 106 consists of the second metal, and the first metal is different than the second metal. The second metal of the first capping layer 106, being different from the first metal, bestows etching selectivity up to with respect to the first metal feature 104. In some instances, the etch rate of the first metal feature 104 can be about 6 to 10 times of the etch rate of the first capping layer 106. The first metal feature 104 may be referred to as M1 layer.

Figure 3:
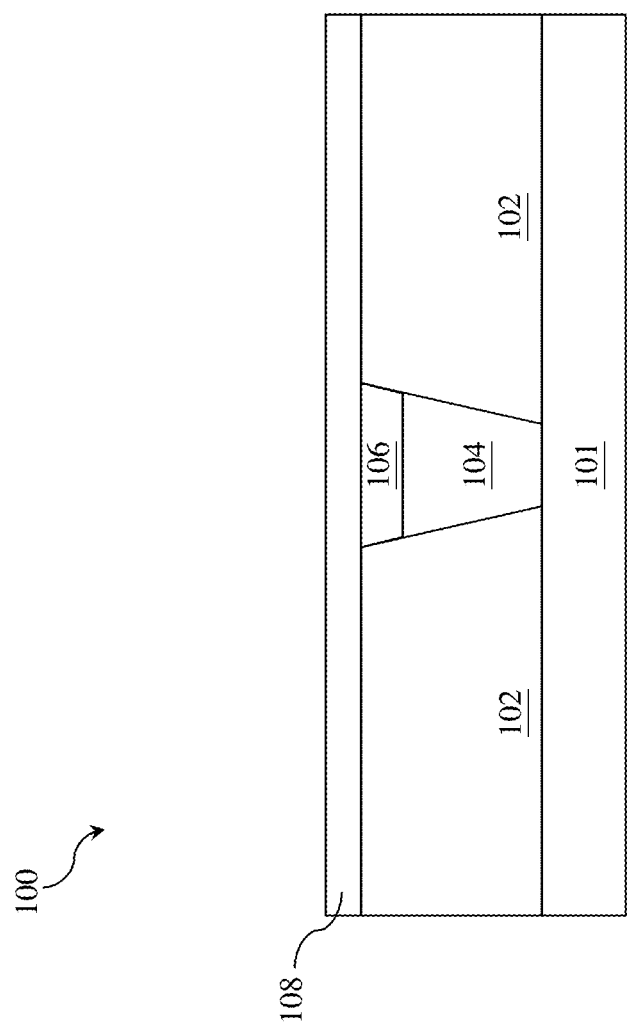

Referring now to FIGS. 1 and 3, the method 10 proceeds to block 14 where a glue layer 108 is deposited over the workpiece 100. The glue layer 108 may include a metal nitride, including without limitation tantalum nitride or titanium nitride. The glue layer 108 may be deposited using CVD, ALD, or spin-on coating. In one or more embodiments, a thickness of the glue layer 108 may range from about 2 to about 100 Å. The glue layer 108 may improve adhesion between a second metal feature 110 and the first ILD layer 102.

Figure 4:
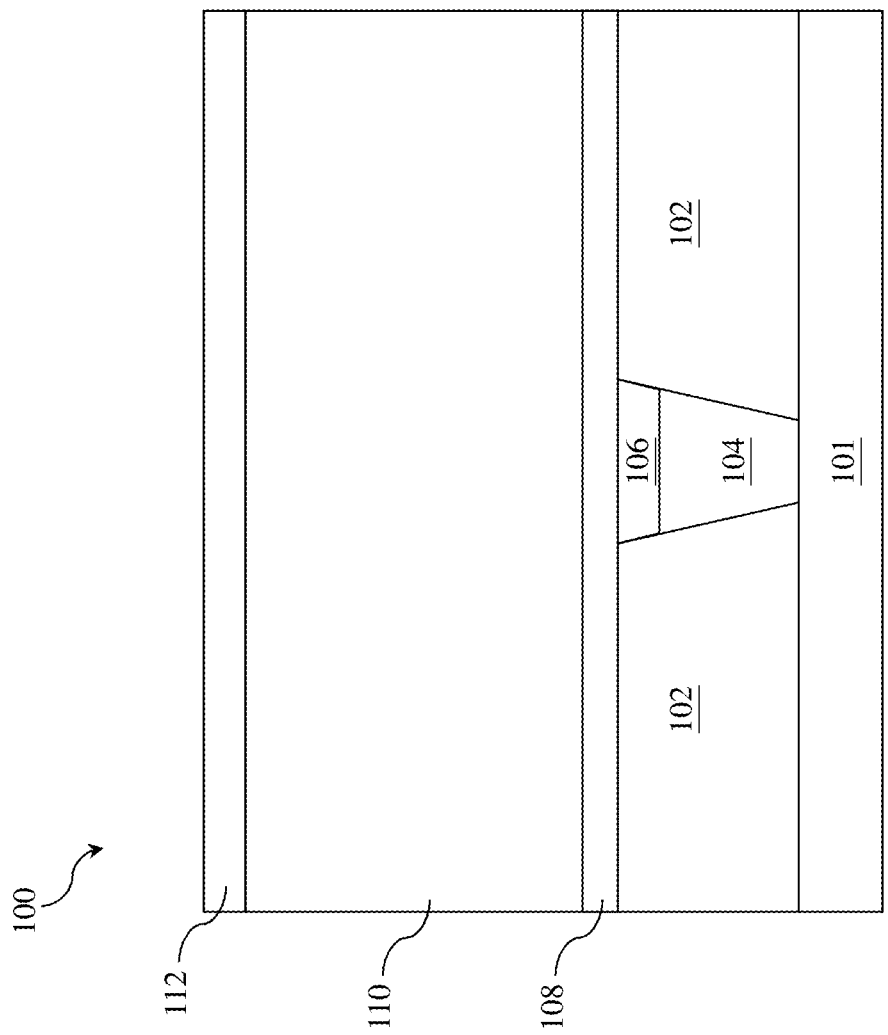

Referring now to FIGS. 1 and 4, the method 10 proceeds to block 16 where the second metal feature 110 is deposited over the workpiece 100. In some embodiments, the second metal feature 110 is formed of a third metal selected from copper, cobalt, ruthenium, molybdenum, chromium, tungsten, manganese, rhodium, iridium, nickel, palladium, platinum, silver, gold, aluminum, and a combination thereof. In some instances, the third metal may be identical to the first metal but is different from the second metal. The second metal feature 110 may be deposited using PVD, CVD, or ALD. In one or more embodiments, a thickness of the second metal feature 110 may range from about 50 to about 500 Å. In the embodiments represented in FIG. 4, the second metal feature 110 is deposited over the first capping layer 106 and the glue layer 108. In addition, in some implementations, the workpiece 100 may be planarized using, for example, CMP, before the method 10 proceeds to block 18.

The second metal feature 110 is electrically coupled to the first metal feature 104 via the first capping layer 106. The second metal feature 110 may be referred to as M2 layer.

Figure 5:
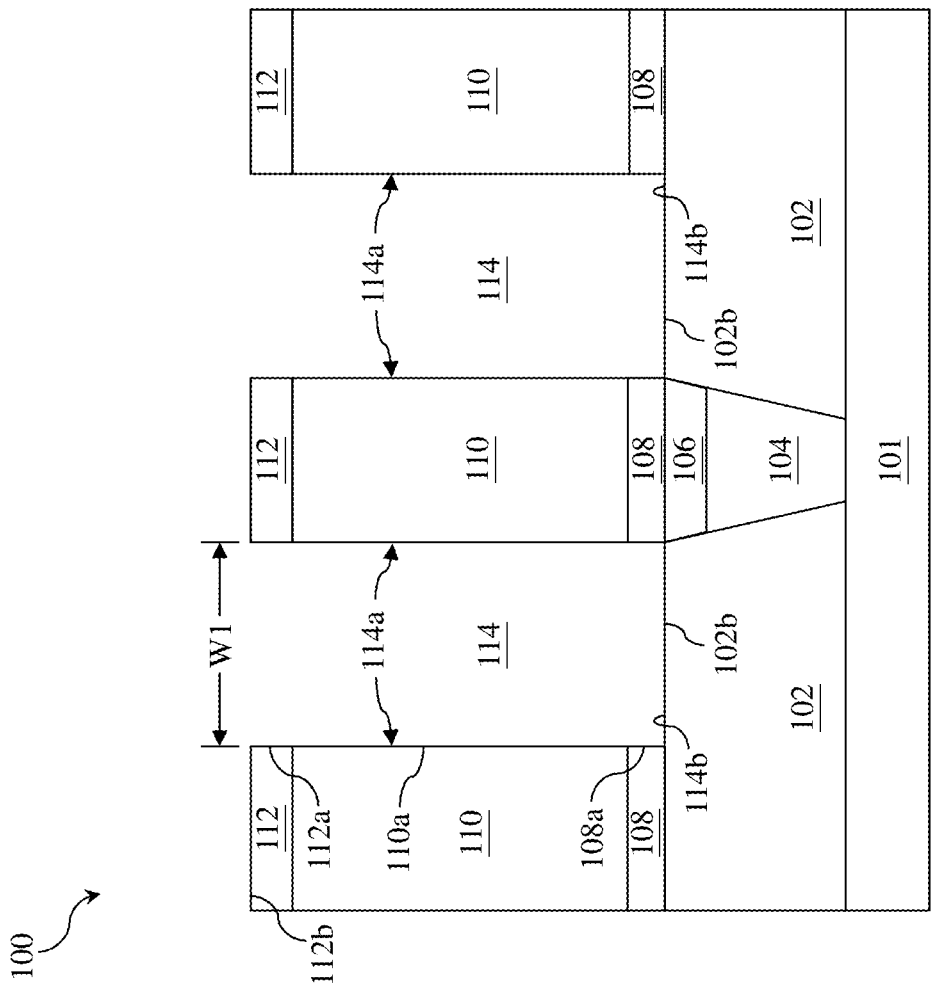

Reference is now made to FIGS. 1 and 5. The method 10 of the present disclosure proceeds to block 18 where the second metal feature 110 and the glue layer 108 are patterned to form a trench 114 adjacent to the first metal feature 104. In embodiments shown in FIG. 5, the glue layer 108 in the trench 114 is completely or at least substantially removed exposing a first ILD layer top surface 102b at a lower surface 114b of the trench 114. In some embodiments, the patterning may be achieved using lithography techniques. A first hard mask layer 112 is deposited over the second metal feature 110, and then a photoresist layer may be formed over the first hard mask layer 112. The photoresist layer and the first hard mask layer 112 are then patterned to serve as an etch mask for etching the underlying second metal feature 110 and the glue layer 108. In some embodiments, the first hard mask layer 112 may include more than one layer, such as a silicon nitride layer and a silicon oxide layer over the silicon nitride layer. In some implementations, the second metal feature 110 may be etched using a dry etching or a wet etching process. For example, when the second metal feature 110 is formed of tungsten, it may be etched using tetrafluoromethane ($CF_4$) gas in a dry etching process or may be etched using a mixture containing nitric acid in a wet etching process. In some instances, a different etching process may be used to etch the glue layer 108 in the trench 114. In some implementations, the glue layer 108 may be etched using a wet etching process. For example, the glue layer 108 may be etched using an acidic or basic etchant, such as phosphoric acid, ammonia fluoride, or alkylamine. Etching of the second metal feature 110 and the glue layer 108 may leave a post etch residue on exposed surfaces of the trench 114, such as sidewalls 114a and the lower surface 114b. The sidewalls 114a correspond to a glue layer sidewall 108a, a second metal feature sidewall 110a, and a first hard mask layer sidewall 112a. In embodiments shown in FIG. 5, metal etch profile angle is about 90 degrees, forming the trench 114 having sidewalls 114a oriented substantially vertically or at about 90 degrees relative to the lower surface 114b, which may be aligned with a horizontal plane of the workpiece 100. In some implementations, the metal etch profile angle may range from about 70 degrees to about 90 degrees forming a trench 114 having sidewalls 114a that diverge from each other between a lower end at the lower surface 114b and an upper end of the sidewalls 114a. In such embodiments, width W1 of the trench 114 may be greater at the upper end than at the lower end.

Figure 6:
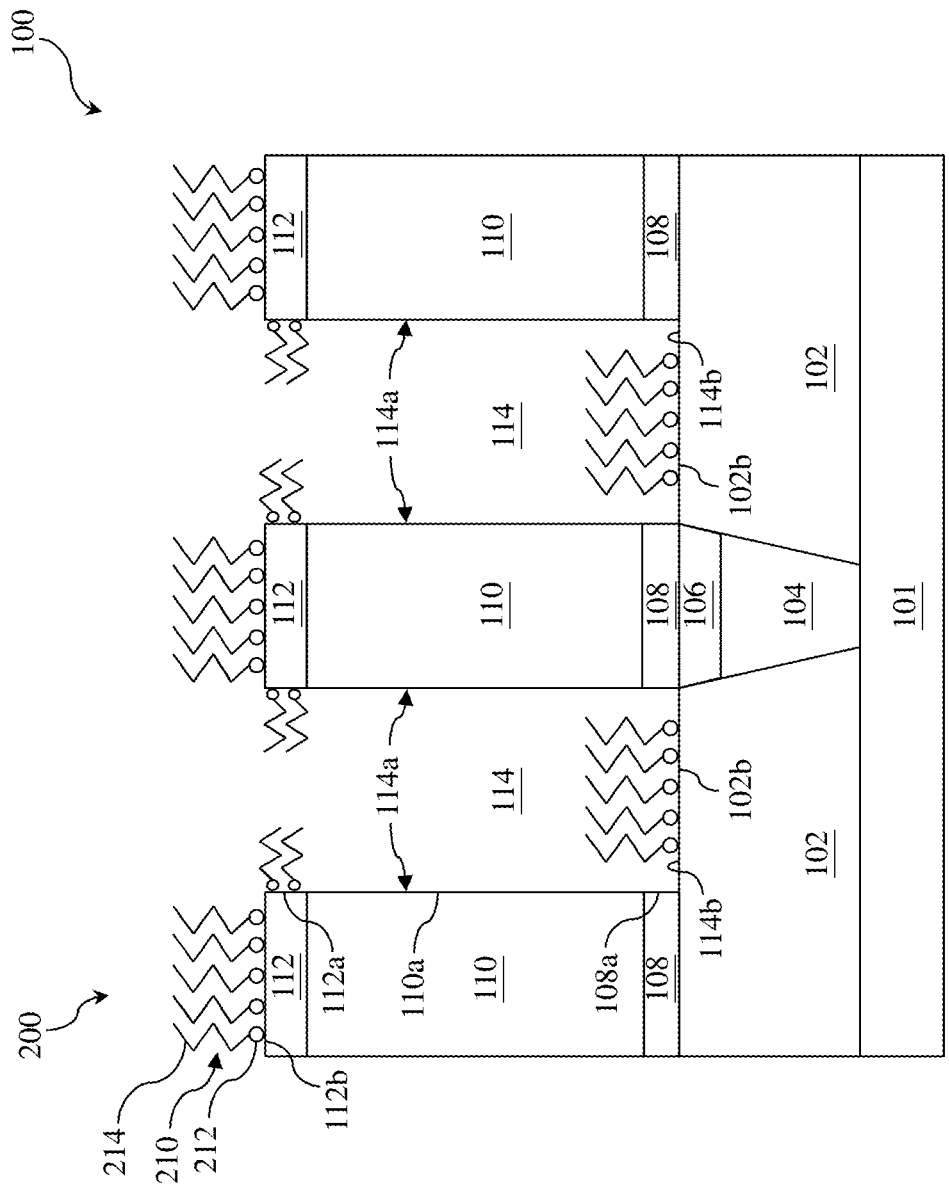

Referring now to FIGS. 1 and 6, the method 10 proceeds to block 20 where a blocking layer 200 is deposited over the first ILD layer 102 and the first hard mask layer 112. In some embodiments, the blocking layer 200 is deposited over the first ILD layer 102 and the first hard mask layer 112 by treating the entire workpiece 100 with a blocking agent 210. In some embodiments, before depositing the blocking layer 200, the workpiece 100 may be pre-treated to remove post etch residue from exposed surfaces of the trench 114 including sidewalls 114a and the lower surface 114b. In some embodiments, the pre-treatment may use a plasma process at temperatures at or above about 200° C. In some embodiments, the pre-treatment may use a wet clean process at temperatures at or below about 100° C. In some embodiments, the pre-treatment may include treating the exposed surfaces with a reducing agent, such as $NH_3$ or $H_2$. The blocking agent 210 may include a head group 212 and a tail 214. In those embodiments, the head group 212 includes functional groups that are attachable to surfaces of a silicon-based material, such as SiO, SiN, SiCN, SiOC, SiOCN, or SiON. In some embodiments, the head group may physically attach and/or form a physical or chemical bond with one or more of the exposed surfaces of the trench 114. In embodiments illustrated in FIG. 6, the blocking agent 210 may preferentially attach to the first ILD layer top surface 102b, the first hard mask layer sidewall 112a, and a first hard mask layer top surface 112b. The blocking agent 210 may disfavor attaching to or completely or at least substantially remain unattached to the glue layer sidewall 108a and the second metal feature sidewall 110a. In some implementations, the head group 212 may include a silicon-containing group or a carbon-containing group. In some embodiments, the tail 214 may include a bulky steric hindrance group, such as a straight chain hydrocarbon or a cyclic hydrocarbon. In some embodiments, the first ILD layer top surface 102b, the first hard mask layer sidewall 112a, and the first hard mask layer top surface 112b may be hydrophilic, whereas upon or after attaching the blocking agent 210, the first ILD layer top surface 102b, the first hard mask layer sidewall 112a, and the first hard mask layer top surface 112b may become hydrophobic. This change in surface chemistry may be imparted by the tail 214, which may include a straight chain hydrocarbon or a cyclic hydrocarbon. In some embodiments, attaching of the blocking agent 210, such as on the first ILD layer top surface 102b, the first hard mask layer sidewall 112a, and the first hard mask layer top surface 112b reduces a surface hydrophilicity relative to the same surfaces before being treated with the blocking agent 210. In some embodiments, attaching the blocking layer 200 to the first ILD layer 102 makes the first ILD layer top surface 102b hydrophobic. Examples of the blocking agent 210 include, without limitation, butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy(dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, and hexadecane. In some embodiments, at block 20, the blocking agent 210 may be deposited using CVD, ALD, spin-on coating, a dipping process, or radical reaction via plasma treatment. In some embodiments, the blocking agent 210 may be vaporized using a temperature of about 100° C. to about 200° C. In some instances, the blocking layer 200 may have a thickness of about 2 Å to about 50 Å.

Figure 7:
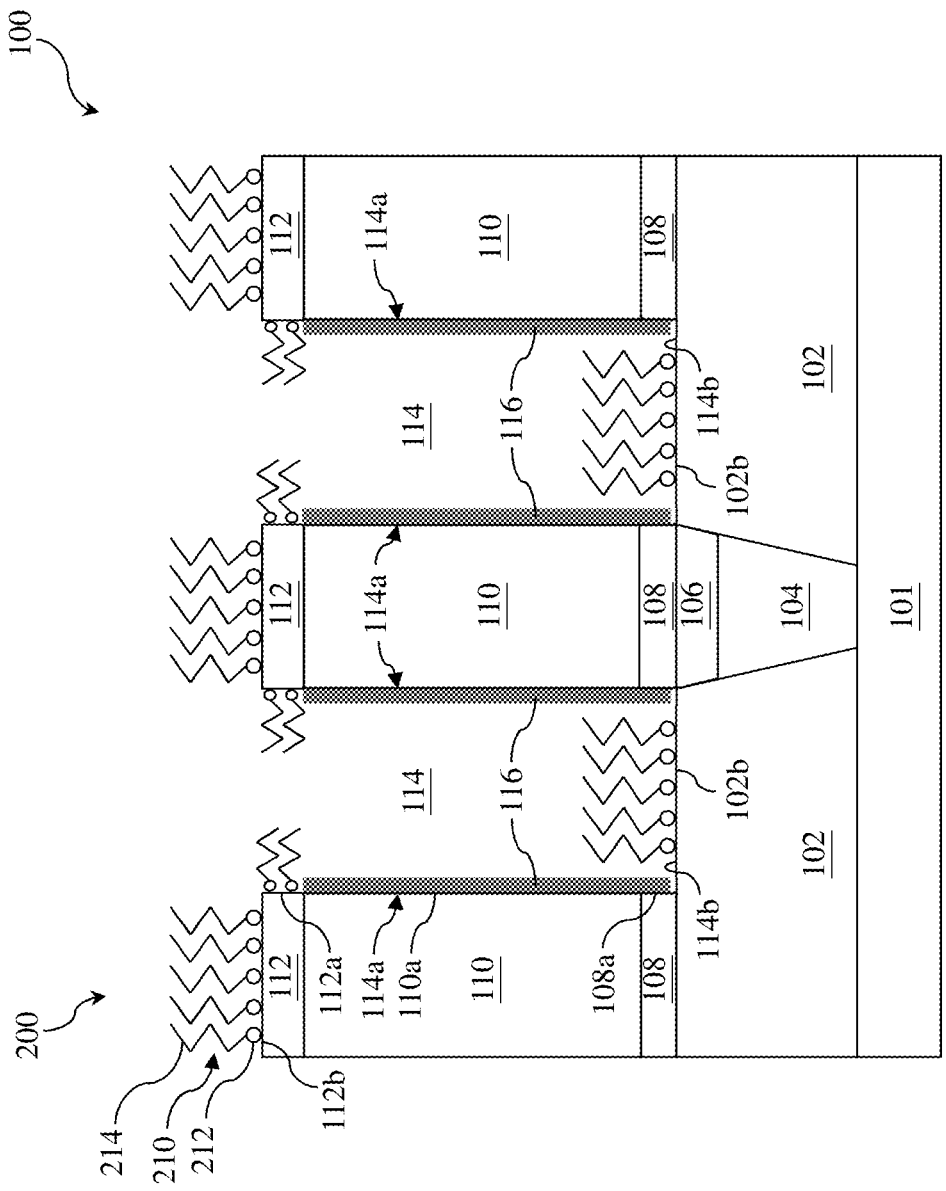

Referring now to FIGS. 1 and 7, the method 10 proceeds to block 22 where a barrier layer 116 is deposited over the workpiece 100. In some embodiments, barrier layer 116 is conformally formed over the workpiece 100, including over the sidewalls 114a of the trench 114. As shown in FIG. 7, the glue layer sidewall 108a and the second metal feature sidewall 110a are lined by the barrier layer 116. The barrier layer 116 may include a metal nitride, including without limitation tantalum nitride or titanium nitride. The barrier layer 116 may be deposited using CVD, ALD, or spin-on coating. In one or more embodiments, a thickness of the barrier layer 116 may range from about 2 to about 100 Å.

The barrier layer 116 may improve adhesion between the second metal feature 110 and a second ILD layer 118. The barrier layer 116 may block and/or reduce diffusion between the second metal feature 110 and the second ILD layer 118. In one or more embodiments, the blocking layer 200 blocks precursors of metal nitride on silicon-based materials. In the embodiment represented in FIG. 7, the blocking layer 200 blocks precursors of metal nitride on the first ILD layer top surface 102b, the first hard mask layer sidewall 112a, and a first hard mask layer top surface 112b. Thus, precursors of metal nitride may only grow on metal surfaces during metal nitride deposition including during deposition of barrier layer 116. In the embodiment represented in FIG. 7, precursors of metal nitride only grow on the glue layer sidewall 108a and the second metal feature sidewall 110a during deposition of the barrier layer 116. In some embodiments, deposition of the barrier layer 116 on silicon-based materials is prevented or at least reduced compared to deposition of the barrier layer 116 on metal-based materials. In some embodiments, the barrier layer 116 is selectively deposited on surfaces free of the blocking layer 200, wherein deposition of the barrier layer 116 on surfaces attached by the blocking layer 200 is prevented or at least reduced compared to deposition of the barrier layer 116 on surfaces not attached by the blocking layer 200. In some embodiments, the blocking layer 200 selectively attaches to the first ILD layer 102 compared to the second metal feature 110 and the glue layer 108. Thus, deposition of the barrier layer 116 on the second metal feature 110 and the glue layer 108 may be reduced compared to deposition of the barrier layer 116 on the first ILD layer 102.

Figure 8:
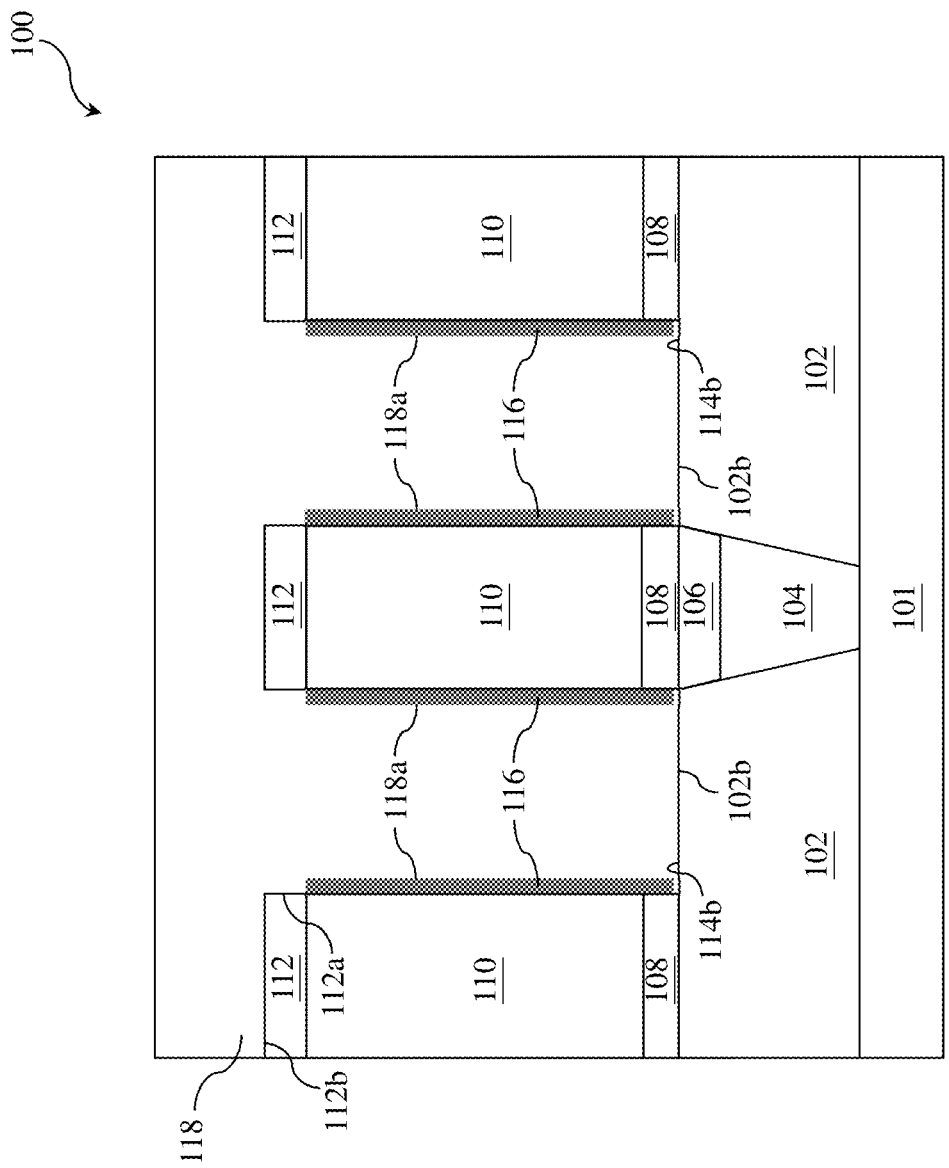

Referring now to FIGS. 1 and 8, the method 10 proceeds to block 24 where the blocking layer 200 is removed and the second ILD layer 118 is deposited over the workpiece 100. In some embodiments, the blocking layer 200 may be removed by dry etching using a plasma that functions as a reducing agent. For example, at block 24, the blocking layer 200 may be removed using a plasma of ammonia ($NH_3$) or hydrogen ($H_2$) diluted in argon (Ar) or helium (He). In some embodiments, the blocking layer 200 may be removed using high temperature treatment. In some embodiments, removal of the blocking layer 200 may be facilitated under conditions that lead to breakdown of C—C or other bonds within the blocking agent 210. In some embodiments, after removal of the blocking layer 200, exposed surfaces of the workpiece 100 may be cleaned or rinsed to remove residue. In some embodiments, the blocking layer 200 may not be removed, instead remaining a part of the finished workpiece 100. However, in some instances, leaving the blocking layer 200 on the workpiece may be undesirable since the carbon-containing groups of the blocking agent 210 are not thermally stable and may create leakage paths and reliability issues. In any case, the blocking layer 200 disposed on the first hard mask layer sidewall 112a and a first hard mask layer top surface 112b is removed in a subsequent CMP process. Therefore, in some embodiments, block 24 may only include removal of the blocking layer 200 from the first ILD layer top surface 102b. As illustrated in FIG. 8, the second ILD layer 118 may be in direct contact with the first ILD layer top surface 102b. A second ILD layer sidewall 118a may be in direct contact with the barrier layer 116, whereas the barrier layer 116 may separate the second ILD layer 118 from the glue layer sidewall 108a and the second metal feature sidewall 110a. The second ILD layer 118 may include a low-K material, such as silicon oxide doped with hydrocarbons. In some implementations, the low-K material may include SiCOH, may have a dielectric constant ranging from about 2.0 to about 3.6, and/or have a porosity ranging from around 0.1% to around 40%. In one or more embodiments, the second ILD layer 118 may be porous for low-K value. In some embodiments, the second ILD layer 118 may provide good adhesion to the barrier layer 116. In some embodiments, at block 24, the second ILD layer 118 may be deposited using CVD, ALD, or spin-on coating.

Figure 9:
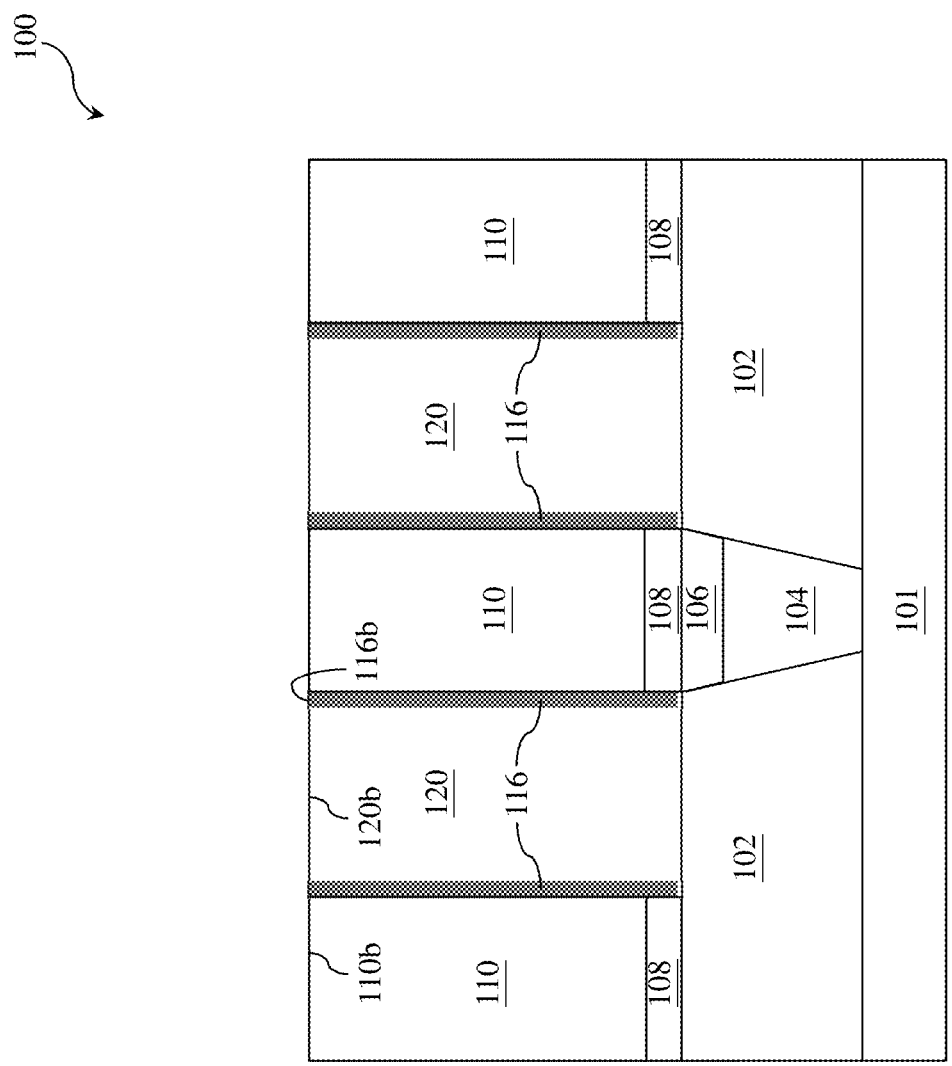

Referring now to FIGS. 1 and 9, the method 10 proceeds to block 26 where the workpiece 100 is planarized using CMP until a top surface 110b of the second metal feature 110 is reached (exposed). In the embodiment represented in FIG. 9, a top surface 120b of the second ILD layer 120 (after CMP), upper ends 116b of the barrier layer 116, and the top surface 110b of the second metal feature 110 may each be exposed following the CMP process and may be coplanar with each other. The CMP process removes the first hard mask layer 112.

Figure 10:
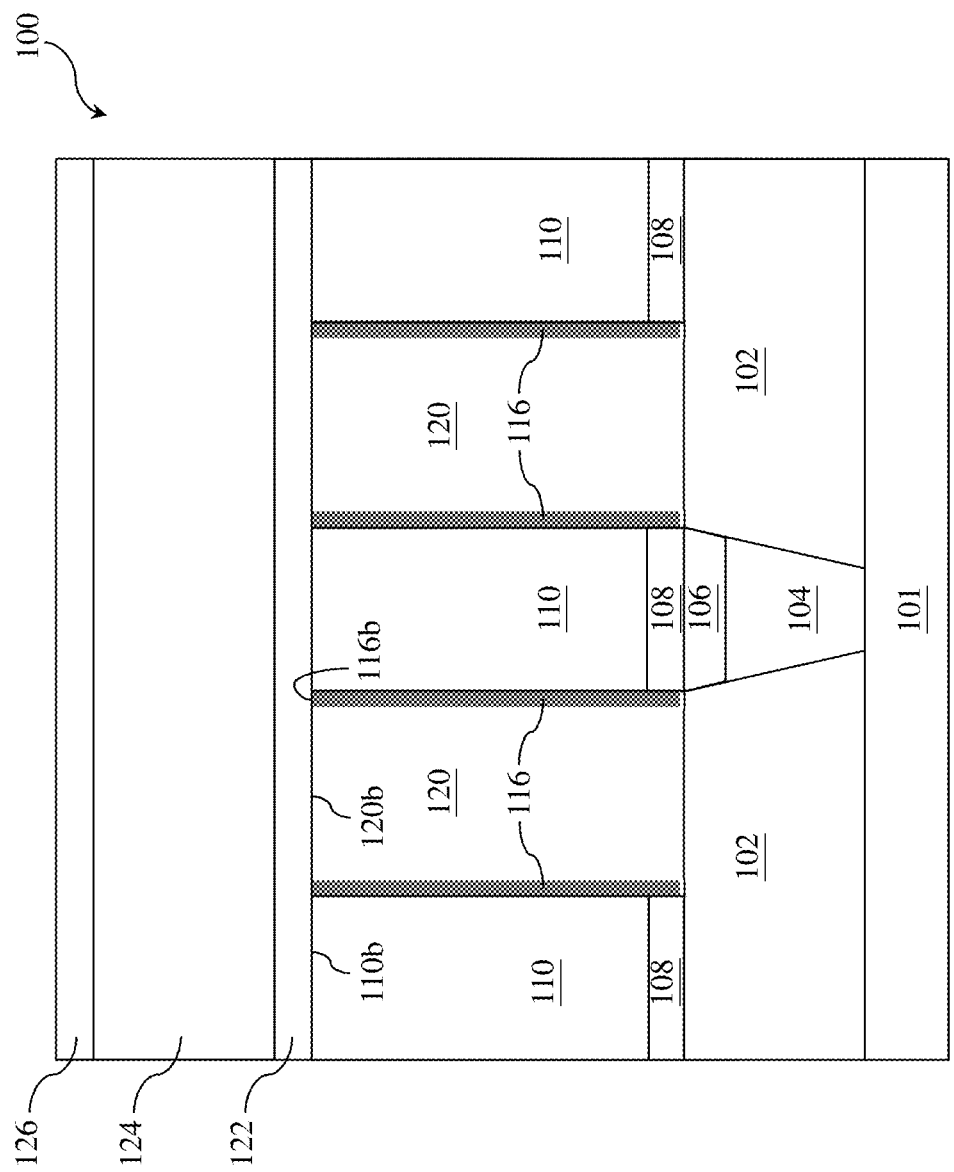

Referring now to FIGS. 1 and 10, the method 10 proceeds to block 28 where a next layer is deposited on the workpiece 100. The next layer may include an etch stop layer 122, a third ILD layer 124, and a second hard mask layer 126. The etch stop layer 122 may include an aluminum-based material selected from AlNx, AlON, and AlOx, a silicon-based material selected from SiCO, SiCN, SiN, and SiCON, or combinations thereof. In some embodiments, the etch stop layer 122 may be deposited over the workpiece 100 using processes that involve use of precursors of the etch stop layer 122, such as PVD, CVD, or ALD. The etch stop layer 122 may have a thickness ranging from about 5 to about 50 Å. The third ILD layer 124 may include a low-K material, such as silicon oxide doped with hydrocarbons. In some implementations, the low-K material may include SiCOH, may have a dielectric constant ranging from about 2.0 to about 3.6, and/or have a porosity ranging from around 0.1% to around 40%. In one or more embodiments, the third ILD layer 124 may be porous for low-K value. In some embodiments, the third ILD layer 124 may provide good adhesion to a third metal feature 130. In some embodiments, at block 28, the third ILD layer 124 may be deposited using CVD, ALD, or spin-on coating. In some embodiments, the second hard mask layer 126 may include more than one layer, such as a silicon nitride layer and a silicon oxide layer over the silicon nitride layer.

Figure 11:
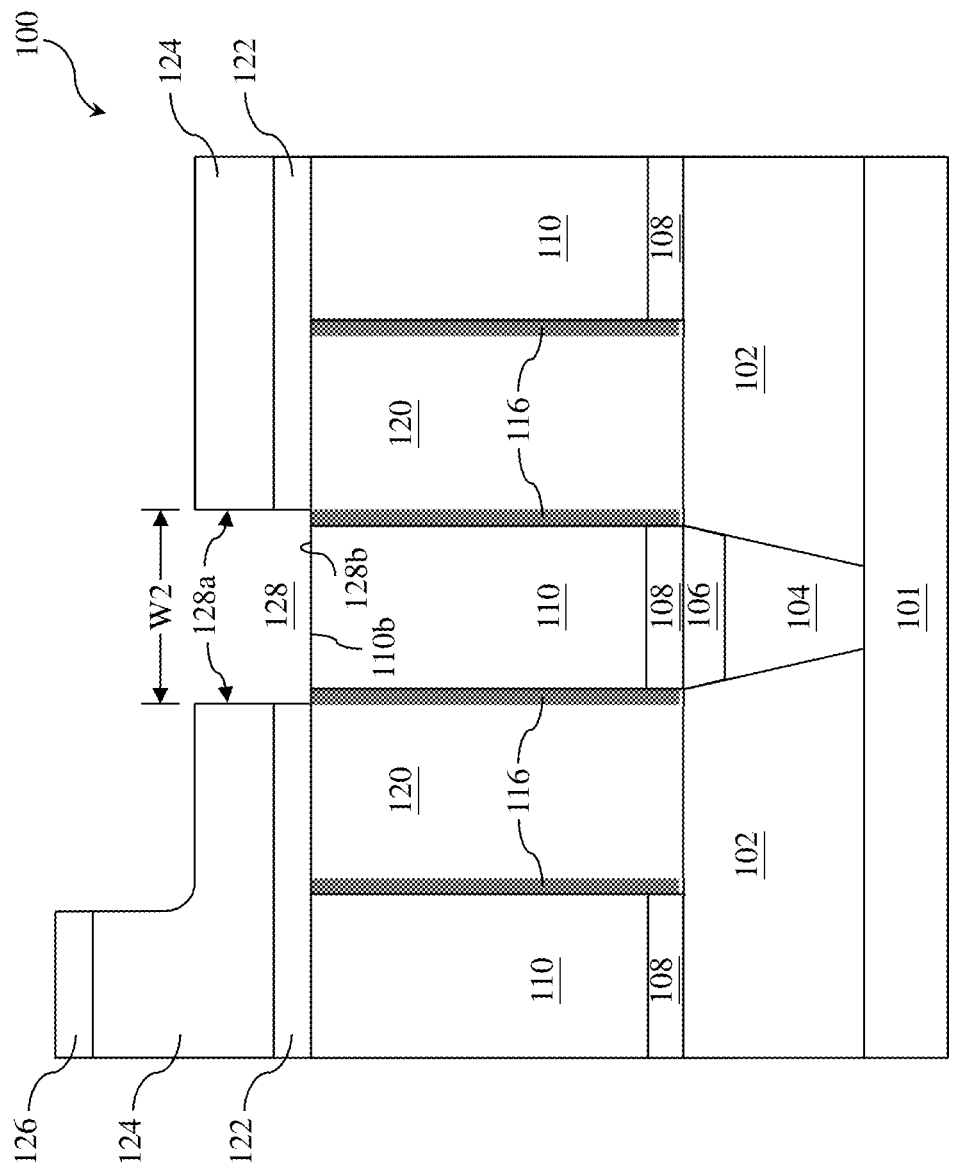

Referring now to FIGS. 1 and 11, the method 10 proceeds to block 30 where the etch stop layer 122, the third ILD layer 124, and the second hard mask layer 126 are patterned to form a trench 128 adjacent to the second metal feature 110. In embodiments shown in FIG. 11, the etch stop layer 122 in the trench 128 is completely or at least substantially removed exposing the top surface 110b of the second metal feature 110 at a lower surface 128b of the trench 128. In some embodiments, the patterning may be achieved using lithography techniques. The second hard mask layer 126 is formed over the etch stop layer 122 and the third ILD layer 124, and then a photoresist layer may be formed over the second hard mask layer 126. The photoresist layer and the second hard mask layer 126 are then patterned to serve as an etch mask for etching the underlying etch stop layer 122 and the third ILD layer 124. In some implementations, the third ILD layer 124 may be etched using a dry etching or a wet etching process. In some instances, a different etching process may be used to etch the etch stop layer 122 in the trench 128. In some implementations, the etch stop layer 122 may be etched using a wet etching process. For example, the etch stop layer 122 may be etched using an acidic or basic etchant, such as phosphoric acid, ammonia fluoride, or alkylamine. In embodiments shown in FIG. 11, etch profile angle is about 90 degrees, forming the trench 128 having sidewalls 128a oriented substantially vertically or at about 90 degrees relative to the lower surface 128b, which may be aligned with a horizontal plane of the workpiece 100. In some implementations, the etch profile angle may range from about 70 degrees to about 90 degrees forming a trench 128 having sidewalls 128a that diverge from each other between a lower end at the lower surface 128b and an upper end of the sidewalls 128a. In such embodiments, width W2 of the trench 128 may be greater at the upper end than at the lower end.

Figure 12:
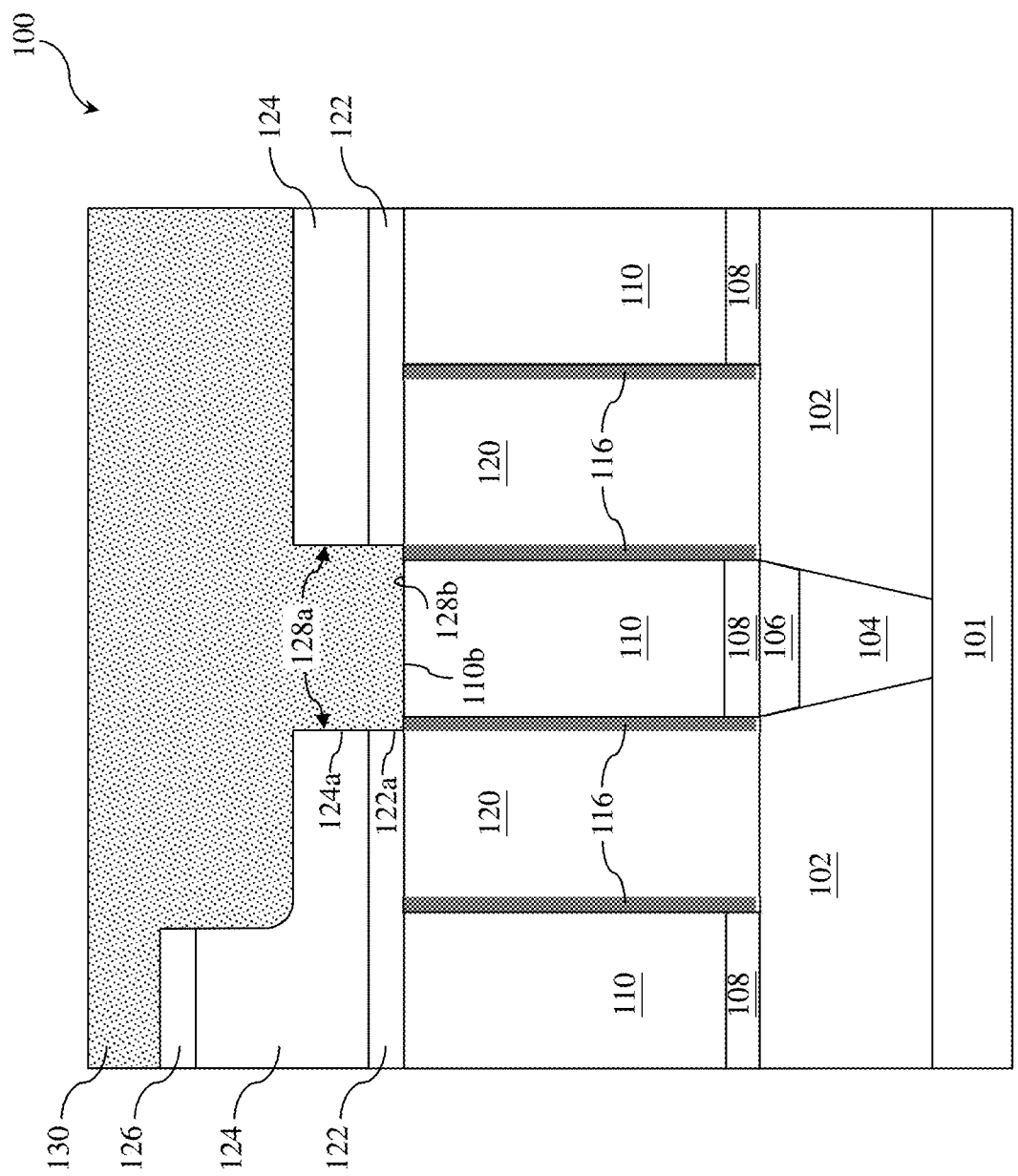

Referring now to FIGS. 1 and 12, the method 10 proceeds to block 32 where the third metal feature 130 is deposited on the workpiece 100. In some embodiments, the third metal feature 130 is formed of a fourth metal selected from copper, cobalt, ruthenium, molybdenum, chromium, tungsten, manganese, rhodium, iridium, nickel, palladium, platinum, silver, gold, aluminum, and a combination thereof. In some instances, the fourth metal may be identical to the first metal and the third metal but is different from the second metal. The third metal feature 110 may be deposited using PVD, CVD, or ALD. In one or more embodiments, a thickness of the third metal feature 110 may range from about 50 to about 1000 Å. In the embodiments represented in FIG. 12, the third metal feature 130 is deposited over the second metal feature 110, the etch stop layer 122, the third ILD layer 124, and the second hard mask layer 126. The third metal feature 130 may be in direct contact with the top surface 110b of the second metal feature 110 at the lower surface 128b of the trench 128. The third metal feature 130 may also be in direct contact with an etch stop layer sidewall 122a and a third ILD layer sidewall 124a within the trench 128. The third metal feature 130 may be referred to as M3 layer.

Figure 13:
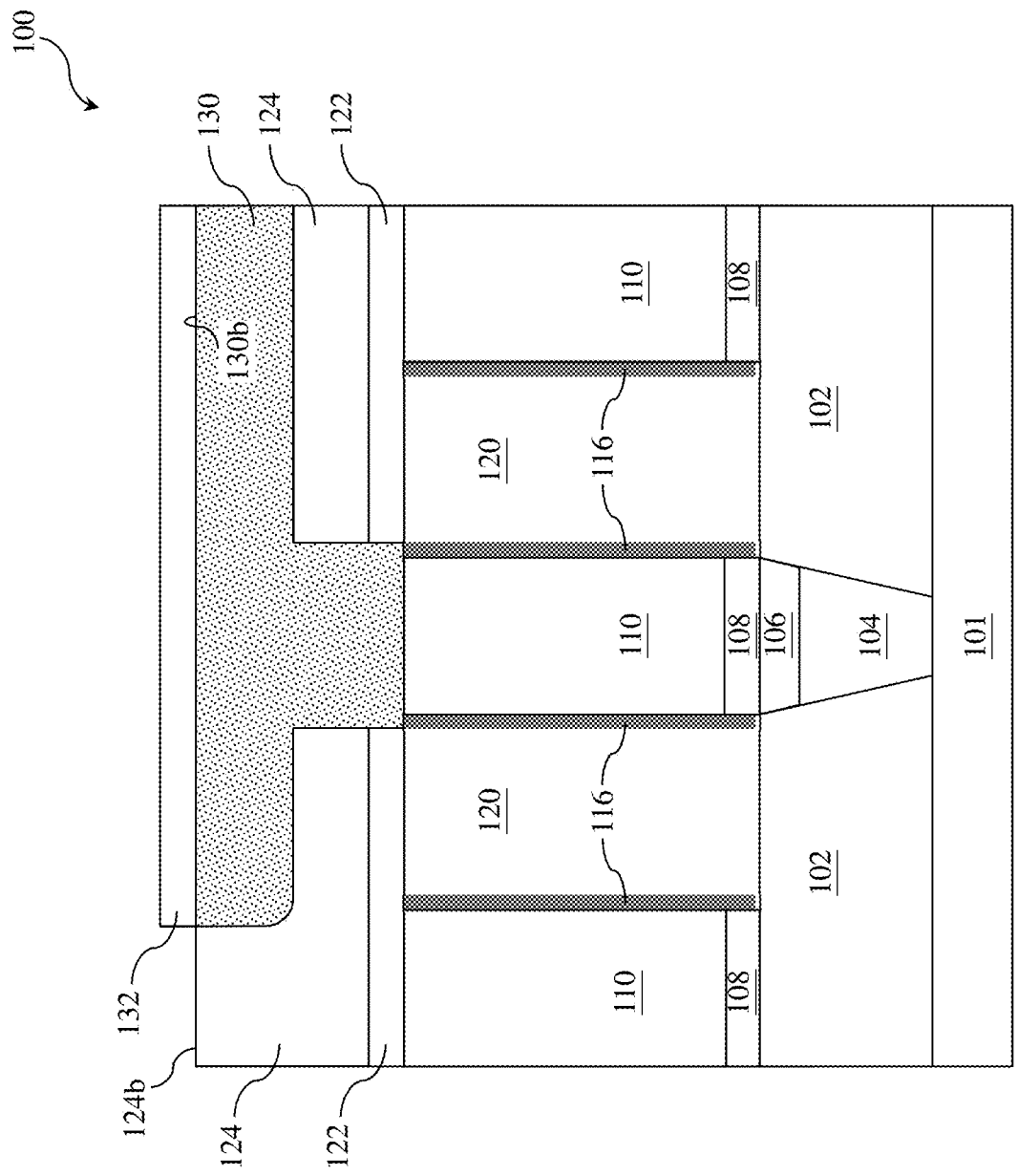

Referring now to FIGS. 1 and 13, the method 10 proceeds to block 34 where the workpiece 100 is planarized using CMP until a top surface 124b of the third ILD layer 124 is reached (exposed). The second hard mask layer 126 is removed in the process. In the embodiment represented in FIG. 13, the top surface 124b of the third ILD layer 124 and a top surface 130b of the third metal feature 130 may each be exposed following the CMP process and may be coplanar with each other. After CMP, a second capping layer 132 is deposited on the workpiece 100. In some embodiments, the second capping layer 132 may include a fifth metal, such as copper, cobalt, ruthenium, molybdenum, chromium, tungsten, manganese, rhodium, iridium, nickel, palladium, platinum, silver, gold, aluminum, and a combination thereof. In some instances, the fifth metal may be identical to the second metal but is different from the first, third, and fourth metals. The second capping layer 132 may be deposited using PVD, CVD, or ALD. In one or more embodiments, a thickness of the second capping layer 132 may range from about 2 to about 50 Å. In the embodiments represented in FIG. 13, the second capping layer 132 is deposited over the third metal feature 130. In some embodiments, the second capping layer 132 may be deposited over the third ILD layer 124.

Referring now to FIG. 1, the method 10 proceeds to block 36 where further processes are performed to fabricate the MLI. For example, other metal features may be formed over the third metal feature 130 to form additional conductive layers of the MLI.

Figure 14:
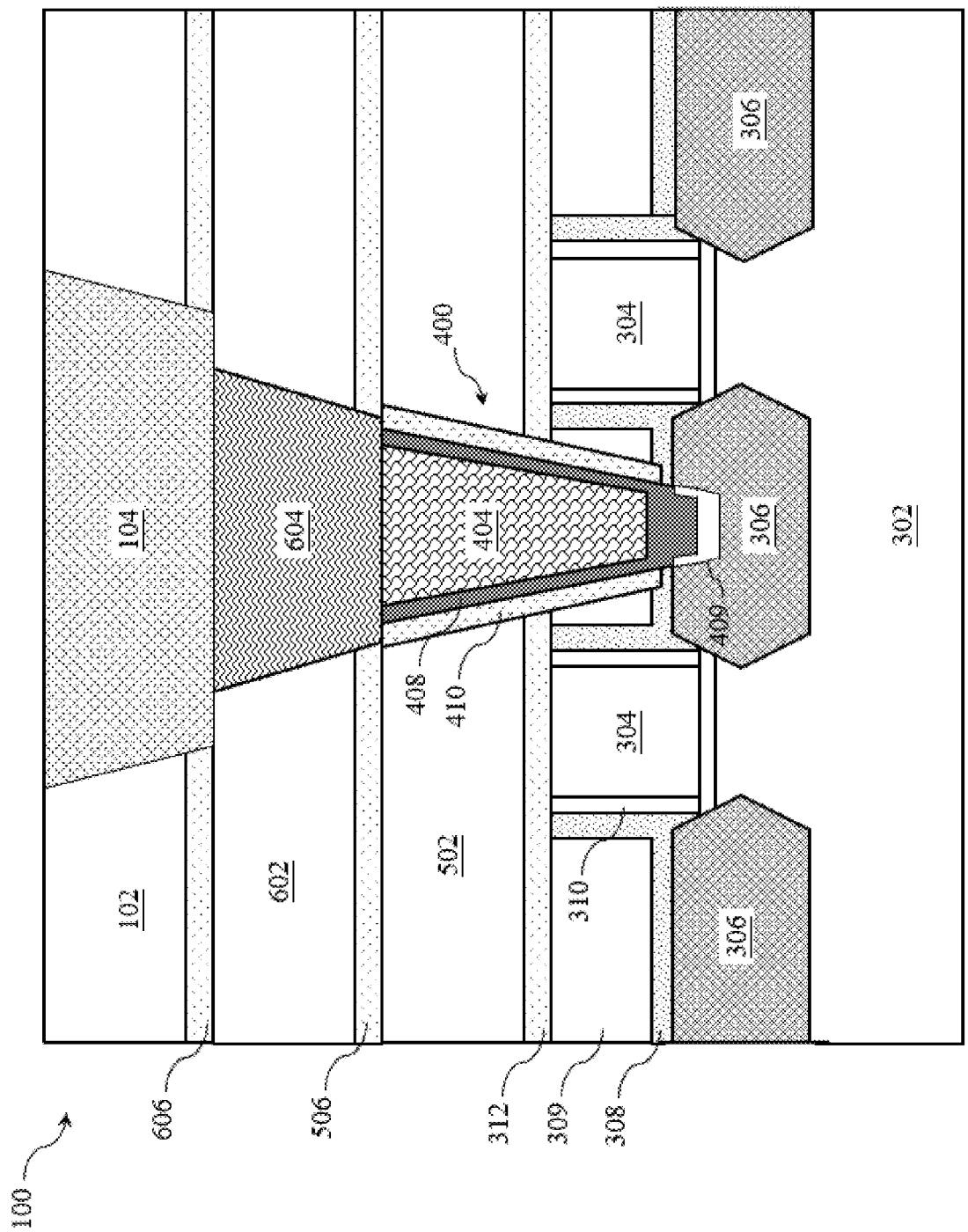
FIG. 14 is a cross-sectional diagrammatic view of structures underlying a contact structure, according to various aspects of the present disclosure.

Referring now to FIG. 14, shown therein is a cross-sectional diagrammatic view of structures of the workpiece 100 underlying an MLI structure, such as that shown in FIG. 13. The workpiece 100 may include a substrate 302 that is formed of silicon. Alternatively or additionally, the substrate 302 includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 302 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 302 can include various doped regions (not shown). In some implementations, substrate 302 includes p-type doped regions (for example, p-type wells) doped with p-type dopants, such as boron (for example, $BF_2$), indium, other p-type dopant, or combinations thereof. In some implementations, substrate 302 includes n-type doped regions (for example, n-type wells) doped with n-type dopants, such as phosphorus, arsenic, other n-type dopant, or combinations thereof. In some implementations, substrate 302 includes doped regions formed with a combination of p-type dopants and n-type dopants. The various doped regions can be formed directly on and/or in substrate 302, for example, providing a p-well structure, an n-well structure, a dual-well structure, a raised structure, or combinations thereof. An ion implantation process, a diffusion process, and/or other suitable doping process can be performed to form the various doped regions.

Various gate structures are disposed over substrate 302, such as gate structures 304. Gate structures 304 each interpose a source region and a drain region, where a channel region is defined in substrate 302 between the source region and the drain region. Gate structures 304 engage the channel regions, such that current can flow between the source/drain regions during operation. In some implementations, gate structures 304 are formed over a fin structure, such that gate structures 304 each wrap a portion of the fin structure. For example, gate structures 304 wrap channel regions of the fin structure, thereby interposing source regions and drain regions of the fin structure. Gate structures 304 include a gate dielectric and a gate electrode. The gate dielectric is disposed on substrate 302, and the gate electrode is disposed on the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide ($k \approx 3.9$). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, barrier layers, and/or metal fill (or bulk) layers. A capping layer can include a material that prevents and/or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A barrier layer can include a material that promotes adhesion between adjacent layers, such as the work function layer and the metal fill layer, and/or a material that blocks and/or reduces diffusion between gate layers, such as the work function layer and the metal fill layer. For example, the barrier layer includes metal (for example, W, Al, Ta, Ti, Ni, Cu, Co, other suitable metal, or combinations thereof), metal oxides, metal nitrides (for example, TiN or TaN), or combinations thereof. In some embodiments, the barrier layer may be formed using a blocking layer, such as the blocking layer 200 in method 10. In these embodiments, the barrier layer may be formed using CVD, ALD, or spin-on coating such that the metal nitride precursors of the barrier layer may be prevented or at least substantially limited from attaching to the silicon features to which the blocking layer is attached. A metal fill layer can include a suitable conductive material, such as Al, W, and/or Cu.

Gate structures 304 further respectively include gate spacers 310. Gate spacers 310 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 302 and subsequently anisotropically etched to form gate spacers 310. In some implementations, gate spacers 310 include a multi-layer structure, such as a first dielectric layer that includes silicon nitride and a second dielectric layer that includes silicon oxide. In some implementations, gate spacers 310 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 302 and subsequently anisotropically etched to form a first spacer set adjacent to gate stacks, and a second dielectric layer including silicon and nitrogen can be deposited over substrate 302 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in source/drain (S/D) regions before and/or after forming gate spacers 310.

Epitaxial source features and epitaxial drain features (referred to as epitaxial source/drain features 306) are disposed in source/drain regions of substrate 302. For example, a semiconductor material is epitaxially grown on substrate 302, forming epitaxial source/drain features 306 over source/drain regions of substrate 302. In the depicted embodiment, gate structures 304 interpose respective epitaxial source/drain features 306, and respective channel regions are defined in substrate 302 between respective epitaxial source/drain features 306 underneath respective gate structures 304. The IC device formed on the workpiece 100 can thus be configured to include a transistor including gate structure 304 and its corresponding epitaxial source/drain features 306. In some implementations, epitaxial source/drain features 306 wrap source/drain regions of one or more fin structures extending from substrate 302, such that the transistors are configured as FinFETs. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable selective epitaxial growth (SEG) processes, or combinations thereof. The epitaxy process can use gaseous and/or liquid precursors, which interact with the composition of substrate 302. Epitaxial source/drain features 306 may be doped with n-type dopants and/or p-type dopants. In some implementations, where a transistor is configured as an n-type device, epitaxial source/drain features 306 can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device, epitaxial source/drain features 306 can be silicon-and-germanium-containing epitaxial layers doped with boron, other p-type dopant, or combinations thereof (for example, forming Si:Ge:B epitaxial layers). In some implementations, epitaxial source/drain features 306 include materials and/or dopants that achieve desired tensile stress and/or compressive stress in the channel region. In some implementations, epitaxial source/drain features 306 are doped during deposition by adding impurities to a source material of the epitaxy process. In some implementations, epitaxial source/drain features 306 are doped by an ion implantation process after a deposition process. In some implementations, annealing processes are performed to activate dopants in epitaxial source/drain features 306 and/or other source/drain regions of the IC device on the workpiece 100.

An isolation feature(s) 309 is formed over and/or in substrate 302 to isolate various regions, such as various device regions, of the IC device on the workpiece 100. For example, isolation features define and electrically isolate active device regions and/or passive device regions from each other. In some implementations, an isolation feature can be configured to isolate transistors corresponding with gate structures 304 and epitaxial source/drain features 306 from other transistors, devices, and/or regions of the IC device on the workpiece 100. Isolation features 309 include an isolation material, such as silicon oxide, silicon nitride, silicon oxynitride, other suitable isolation material (for example, including silicon, oxygen, nitrogen, carbon, and/or other suitable isolation constituent), or combinations thereof. Isolation features can include different structures, such as shallow trench isolation (STI) structures, deep trench isolation (DTI) structures, and/or local oxidation of silicon (LOCOS) structures. In some implementations, isolation features 309 can be formed by etching trenches in substrate 302 (for example, by using a dry etch process and/or wet etch process) and filling the trenches with insulator material (for example, by using a chemical vapor deposition process or a spin-on glass process). A CMP process may be performed to remove excessive insulator material and/or planarize a top surface of the isolation features 309. In some implementations, isolation features 309 can be formed by depositing an insulator material over substrate 302 after forming fins, such that the insulator material layer fills gaps (trenches) between fins and etching back the insulator material layer. In some implementations, isolation features include multilayer structures that fill trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features 309 include a dielectric layer disposed over a doped liner layer (including, for example, boron silicate glass or phosphosilicate glass).

The structure shown in FIG. 14 further includes one or more contact etch stop layers (CESL) disposed over substrate 302, such as a CESL 308 disposed between isolation features 309 and device-level features (here, gate structures 304 and epitaxial source/drain features 306), a CESL 312 disposed between isolation features 309 and ILD layer 502, a CESL 506 between ILD layer 502 and the ILD layer 602, and a CESL 606 between the ILD layer 602 and the ILD layer 102. These CESLs 308, 312, 506 and 606 include a material different than isolation features 309, ILD layer 502, ILD layer 602, and ILD layer 102 to achieve etching selectivity during processing, such that these CESLs can be selectively etched relative to ILD layers (in other words, with no or minimal etching of ILD layers), and vice versa. For example, these CESLs include a dielectric material that is different than the dielectric material of ILD layers. The dielectric material can be silicon oxide, silicon nitride, silicon oxynitride, silicon carbide, silicon oxycarbonitride, other suitable dielectric material (for example, including silicon, oxygen, nitrogen, carbon, and/or other suitable isolation constituent), or combinations thereof. In the depicted embodiment, where isolation feature 309, ILD layers 502, 602, and 102 include an oxygen-containing material, CESLs 308, 312, 506 and 606 include a nitrogen-containing material. For example, CESLs 308, 312, 506 and 606 include silicon and nitrogen, such as silicon nitride or silicon oxynitride, such that CESLs 308, 312, 506 and 606 can be referred to as nitride layers. In some implementations, CESLs 308, 312, 506 and 606 can include a multilayer structure having multiple dielectric materials. CESLs 308, 312, 506 and 606 are formed by a deposition process, such as CVD, PVD, ALD, HDPCVD, MOCVD, RPCVD, PECVD, LPCVD, ALCVD, APCVD, other suitable methods, or combinations thereof.

The structure shown in FIG. 14 includes a source/drain contact 400 to electrically couple to the epitaxial source/drain feature 306. In some embodiments represented in FIG. 14, the source/drain contact 400 includes a source/drain contact spacer 410, a source/drain contact liner 408, and a source/drain contact bulk layer 404. In some implementations, the source/drain contact 400 extends through the ILD layer 502, CESL 312, the isolation feature 309, and the CESL 308 to reach the recessed epitaxial source/drain feature 306. In some embodiments, the source/drain contact spacer 410 may include a material different than the ILD layers to achieve etching selectivity. The material for the source/drain contact spacer may include silicon oxide, silicon nitride, silicon oxynitride, silicon carbide, silicon oxycarbonitride, other suitable dielectric material (for example, including silicon, oxygen, nitrogen, carbon, and/or other suitable isolation constituent), or combinations thereof. In some implementations, the source/drain contact liner 408 may be formed of titanium, titanium alloy, tantalum, tantalum alloy, cobalt, cobalt alloy, ruthenium, ruthenium alloy, molybdenum, molybdenum alloy, other suitable constituent, or combinations thereof. In some embodiments, the source/drain contact bulk layer 404 may be formed of cobalt, tungsten, or ruthenium. In some embodiments, the source/drain contact liner 408 and the source/drain contact bulk layer 404 may be formed using PVD, CVD, ALD, electroplating, electroless plating, other suitable deposition process, or combinations thereof. In some embodiments, an anneal may be performed to form a metal silicide feature 409 by reacting the source/drain contact liner 408 and the recessed epitaxial source/drain feature 306. In some instances, the metal silicide feature 409 may include titanium silicide, tantalum silicide, cobalt silicide, ruthenium silicide, or molybdenum silicide.

In some embodiments, the structure in FIG. 14 may include a fourth metal feature 604 that is electrically coupled to the first metal feature 104. The fourth metal feature 604 may be referred to as M0, as compared to M1, M2, and M3 overlying the fourth metal feature 604. The fourth metal feature 604 may have similar composition to the first metal feature 104 and may be formed using processes similar to those used to form the first metal feature 104.

Embodiments of the present disclosure provide advantages. The present disclosure provides methods, such as method 10, to form an MLI structure that includes a barrier layer selectively deposited on metal surfaces. The present disclosure also provides an MLI structure such as that shown in FIG. 14, formed using methods of the present disclosure that provides high metal gap-fill performance, prevents and/or limits damage to gap-fill material, such as ILD layers, during etching, and prevents line-line leakage and barrier layer bridging between metal features.

The present disclosure provides for many different embodiments. In one embodiment, a method is provided. The method includes providing a workpiece including a semiconductor substrate, a first ILD layer over the semiconductor substrate, and a first metal feature in the first ILD layer; depositing a second metal feature over the workpiece such that the second metal feature is electrically coupled to the first metal feature; patterning the second metal feature to form a first trench adjacent to the first metal feature; depositing a blocking layer over the workpiece, wherein the blocking layer selectively attaches to the first ILD layer; depositing a barrier layer over the workpiece, wherein the barrier layer selectively forms over the second metal feature relative to the first ILD layer; and depositing a second ILD layer over the workpiece.

In some embodiments, the method includes removing the blocking layer before the depositing of the second ILD layer. In some embodiments, the method includes depositing a glue layer over the first ILD layer; and patterning the glue layer, wherein the blocking layer selectively attaches to the first ILD layer relative to the glue layer. In some embodiments, the blocking layer selectively attaches to the first ILD layer relative to the second metal feature. In some embodiments, the blocking layer is deposited using CVD, ALD, spin-on coating, a dipping process, or radical reaction via plasma treatment. In some embodiments, the attaching of the blocking layer to the first ILD layer makes a surface of the first ILD layer hydrophobic. In some embodiments, the blocking layer includes a blocking agent and the blocking agent includes a head group and a tail. In some embodiments, the head group includes a silicon-containing group or a carbon-containing group. In some embodiments, the tail includes a straight chain hydrocarbon or a cyclic hydrocarbon. In some embodiments, the first ILD layer includes silicon oxide. In some embodiments, the blocking layer includes a blocking agent having a silicon-bonding head group. In some embodiments, the silicon-bonding head group attaches to the first ILD layer. In some embodiments, the blocking layer is deposited using a vaporization temperature of about 100-200° C. In some embodiments, the blocking layer has a thickness of about 2-50 Å.

In another embodiment, a method is provided. The method includes providing a workpiece including a semiconductor substrate, a first ILD layer over the semiconductor substrate, a first metal feature in the first ILD layer, and a second metal feature over the first ILD layer such that the second metal feature is electrically coupled to the first metal feature; patterning the second metal feature to form a first trench adjacent to the first metal feature; treating the workpiece with a blocking agent having a head group attachable to the first ILD layer; depositing a barrier layer over the workpiece, wherein the blocking agent prevents the barrier layer from being deposited over the first ILD layer; removing the blocking agent to expose the first ILD layer; and depositing a second ILD layer over the workpiece.

In still another embodiment, an integrated circuit device is provided. The integrated circuit device includes a semiconductor substrate; a first ILD layer over the semiconductor substrate, the first ILD layer having a top surface; a first metal feature in the first ILD layer; a second ILD layer over the first ILD layer; a second metal feature in the second ILD layer such that the second metal feature is electrically coupled to the first metal feature; and a barrier layer on a sidewall of the second ILD layer, the barrier layer including a metal nitride, wherein the top surface of the first ILD layer is free from the barrier layer. In some embodiments, the device includes a glue layer over the first ILD layer, wherein the barrier layer is on a sidewall of the glue layer. In some embodiments, the barrier layer includes titanium nitride or tantalum nitride. In some embodiments, the barrier layer has a thickness of about 2-100 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a workpiece including a semiconductor substrate, a first ILD layer over the semiconductor substrate, and a first metal feature over the first ILD layer;
forming a hard mask layer directly on the first metal feature, the hard mask having a top surface facing away from the semiconductor substrate;
depositing a blocking layer over the workpiece, wherein the blocking layer selectively attaches to the first ILD layer and the top surface of the hard mask layer; and
depositing a barrier layer over the workpiece, wherein the barrier layer selectively forms over the first metal feature relative to the first ILD layer and the hard mask layer.

2. The method of claim 1, wherein the workpiece further includes a second metal feature disposed in the first ILD layer; and
wherein the second metal feature is underlying and is electrically coupled to the first metal feature, and
wherein the second metal feature is underlying and electrically coupled to the first metal feature during the depositing of the blocking layer over the workpiece.

3. The method of claim 1, further comprising
removing the blocking layer; and
depositing a second ILD layer over the workpiece.

4. The method of claim 1, further comprising:
depositing a glue layer over the first ILD layer; and
patterning the glue layer, wherein the blocking layer selectively attaches to the first ILD layer relative to the glue layer and the first metal feature.

5. The method of claim 1, wherein the blocking layer is deposited using CVD, ALD, spin-on coating, a dipping process, or radical reaction via plasma treatment.

6. The method of claim 1, wherein the attaching of the blocking layer to the first ILD layer makes a surface of the first ILD layer hydrophobic.

7. The method of claim 1, wherein the blocking layer includes a blocking agent and the blocking agent includes a head group and a tail;
wherein the head group includes a silicon-containing group or a carbon-containing group; and
wherein the tail includes a straight chain hydrocarbon or a cyclic hydrocarbon.

8. The method of claim 1, wherein the first ILD layer includes silicon oxide;
wherein the blocking layer includes a blocking agent having a silicon-bonding head group; and
wherein the silicon-bonding head group attaches to the first ILD layer.

9. The method of claim 1, prior to the depositing a blocking layer over the workpiece, further comprising applying a pre-treatment to the workpiece using a plasma process at temperatures at or above about 200° C., wherein the blocking layer is deposited using a vaporization temperature of about 100-200° C.

10. The method of claim 1, prior to the depositing a blocking layer over the workpiece, further comprising applying a pre-treatment to the workpiece using a wet clean process at temperatures at or below about 100° C., wherein the blocking layer is deposited using a vaporization temperature of about 100-200° C.

11. A method comprising:
providing a workpiece including a semiconductor substrate, a first ILD layer over the semiconductor substrate, a first metal feature in the first ILD layer, and a second metal feature over the first ILD layer such that the second metal feature is electrically coupled to the first metal feature;
treating the workpiece with a blocking agent having a head group attachable to the first ILD layer;
depositing a barrier layer over the workpiece, wherein the blocking agent prevents the barrier layer from being deposited over the first ILD layer; and
removing the blocking agent to expose the first ILD layer.

12. The method of claim 11, further comprising
forming a capping layer on the first metal feature;

depositing a glue layer over the first ILD layer and the capping layer;

patterning the second metal feature and the glue layer to form a first trench adjacent to the first metal feature prior to the treating the workpiece with a blocking agent; and depositing a second ILD layer over the workpiece after the removing the blocking agent.

13. The method of claim 12, wherein the blocking agent selectively attaches to the first ILD layer relative to the second metal feature and the glue layer.

14. The method of claim 11, wherein the blocking agent further includes a tail attached to the head group;

wherein the head group includes a silicon-containing group or a carbon-containing group; and wherein the tail includes a straight chain hydrocarbon or a cyclic hydrocarbon.

15. The method of claim 11, prior to the treating the workpiece with a blocking agent, further comprising performing a pre-treatment to the workpiece with a reducing agent including one of NH3 and H2.

16. The method of claim 11, further comprising:

performing a CMP process on the workpiece;

depositing an etch stop layer and a third ILD layer over the workpiece;

patterning the etch stop layer and the third ILD layer to form a second trench adjacent to the second metal feature; and depositing a third metal feature over the workpiece such that the third metal feature is electrically coupled to the second metal feature.

17. A method comprising:

providing a workpiece including a semiconductor substrate, a first ILD layer over the semiconductor substrate, and a first metal feature in the first ILD layer;

forming a second metal feature over the workpiece and electrically coupled to the first metal feature;

treating the workpiece with a blocking agent having a head group attachable to the first ILD layer, thereby selectively forming a blocking layer to the first ILD layer; and depositing a barrier layer over the workpiece, wherein the barrier layer selectively forms over the second metal feature relative to the first ILD layer.

18. The method of claim 17, further comprising performing a pre-treatment with a reducing agent having at least one of $NH_3$ and $H_2$ before treating the workpiece with a blocking agent, wherein the blocking agent further includes a tail, wherein the head group includes one of a silicon-containing group and a carbon-containing group, and wherein the tail includes a bulky steric hindrance group selected from the group consisting of a straight chain hydrocarbon and a cyclic hydrocarbon.

19. The method of claim 17, further comprising a capping feature selectively disposed on the first metal feature, wherein the first metal feature includes a first metal, wherein the capping layer includes a second metal being different from the first metal in composition, wherein the barrier layer includes a first portion and a second portion on opposite sides of the second metal feature, and wherein the capping feature spans between a first edge of the first portion of the barrier layer and a second edge of the second portion of the barrier layer.

20. The method of claim 19, wherein the capping layer includes a top surface being coplanar with a top surface of the first ILD layer.

* * * * *